United States Patent [19]
Van Hunsel et al.

[11] Patent Number: 5,635,321
[45] Date of Patent: Jun. 3, 1997

[54] METHOD FOR PREPARING A LITHOGRAPHIC PRINTING PLATE

[75] Inventors: Johan Van Hunsel, Berchem; Jacobus Bosschaerts, Mortsel, both of Belgium

[73] Assignee: Agfa-Gevaert N.V., Mortsel, Belgium

[21] Appl. No.: 554,855

[22] Filed: Nov. 7, 1995

[30] Foreign Application Priority Data

Nov. 15, 1994 [EP] European Pat. Off. .............. 94203326

[51] Int. Cl.$^6$ ................ G03C 8/32; G03C 5/08; G03F 7/07
[52] U.S. Cl. .............. 430/30; 430/204; 430/244; 430/395; 430/397; 430/494; 358/480; 358/481; 358/486
[58] Field of Search ........................ 430/30, 204, 244, 430/395, 397, 494; 358/480, 481, 486

[56] References Cited

U.S. PATENT DOCUMENTS 3,950,888  4/1976  Hamada .................. 250/236
5,191,447  3/1993  Pinard .................... 358/481

*Primary Examiner*—Richard L. Schilling
*Attorney, Agent, or Firm*—Brumbaugh, Graves, Donohue & Raymond

[57] ABSTRACT

A modulated writing light beam (18) having a wavelength to which an imaging element (33) is sensitive and a reference light beam (46) having a wavelength to which the imaging element (33) is insensitive are generated and simultaneously directed to a moving optical device (22) to cause the writing light beam (18) to scan across the surface of the imaging element (33) in a first scanning direction (C) and the reference light beam (46) to scan across the surface of a light detecting element (50) in the first scanning direction (C) to generate signals indicative of the position of the writing light beam (18) on the surface of the imaging element (33). The writing light beam (18) is modulated and the imaging element (33) is moved in a second scanning direction (B) in response to the signals generated by the light detecting element (50). Thereafter the exposed imaging element (33) is processed to prepare a lithographic printing plate. The invention is applicable to both positive and negative imaging working systems.

9 Claims, 3 Drawing Sheets

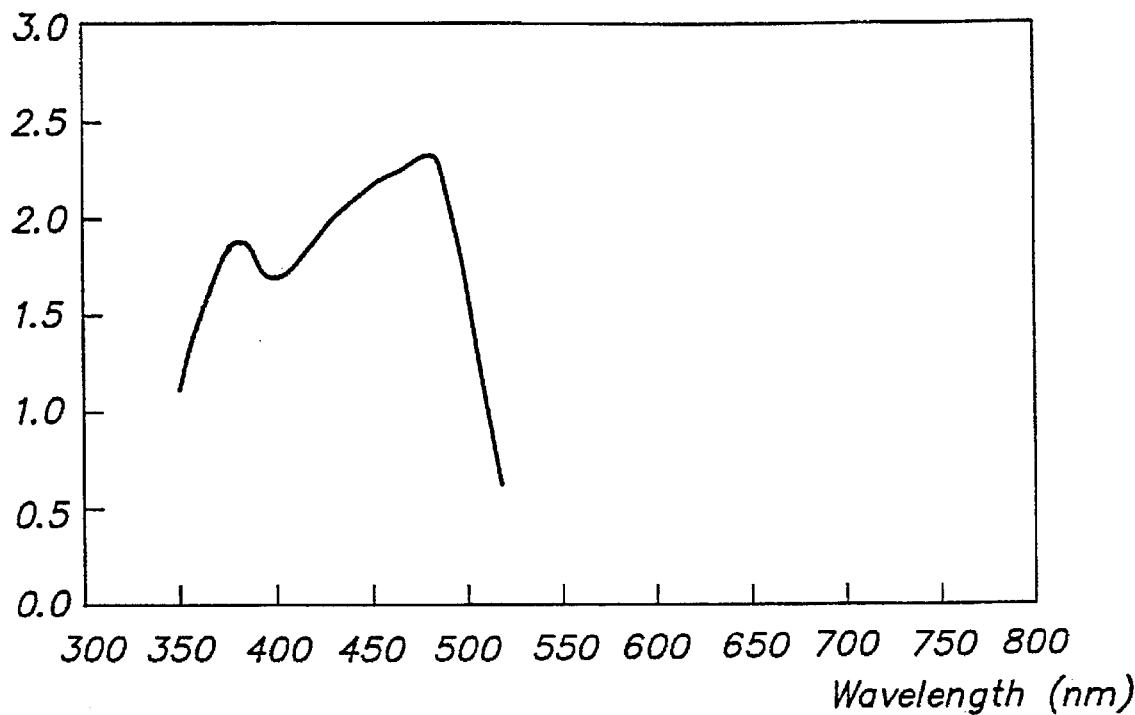
LITHOSTAR LAP-B  FIG. 2
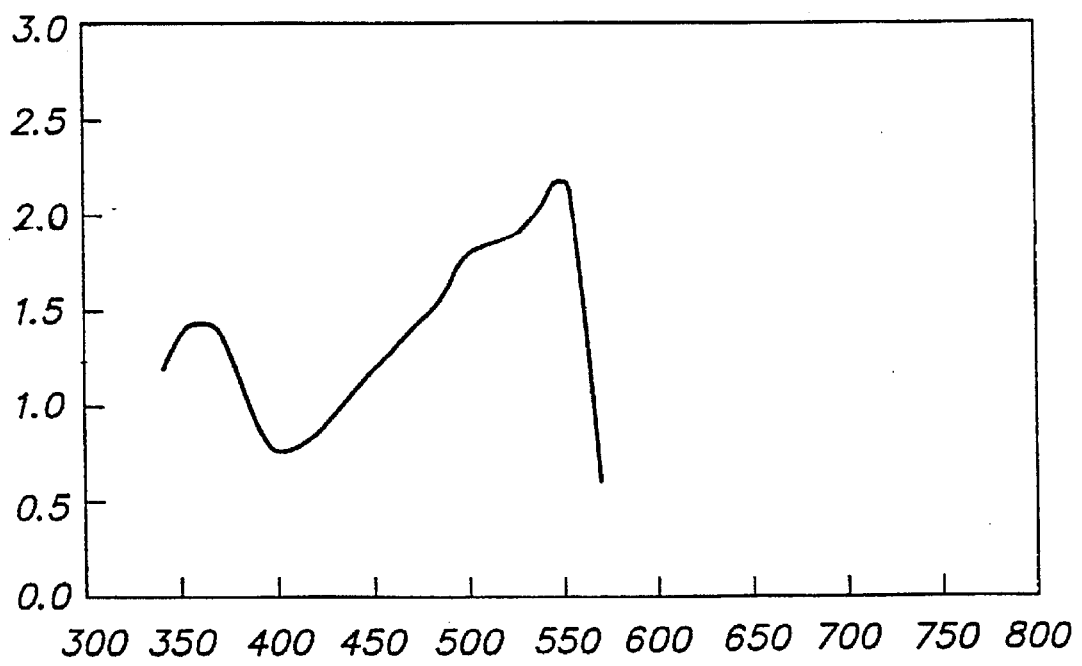
LITHOSTAR LAP-O  FIG. 3

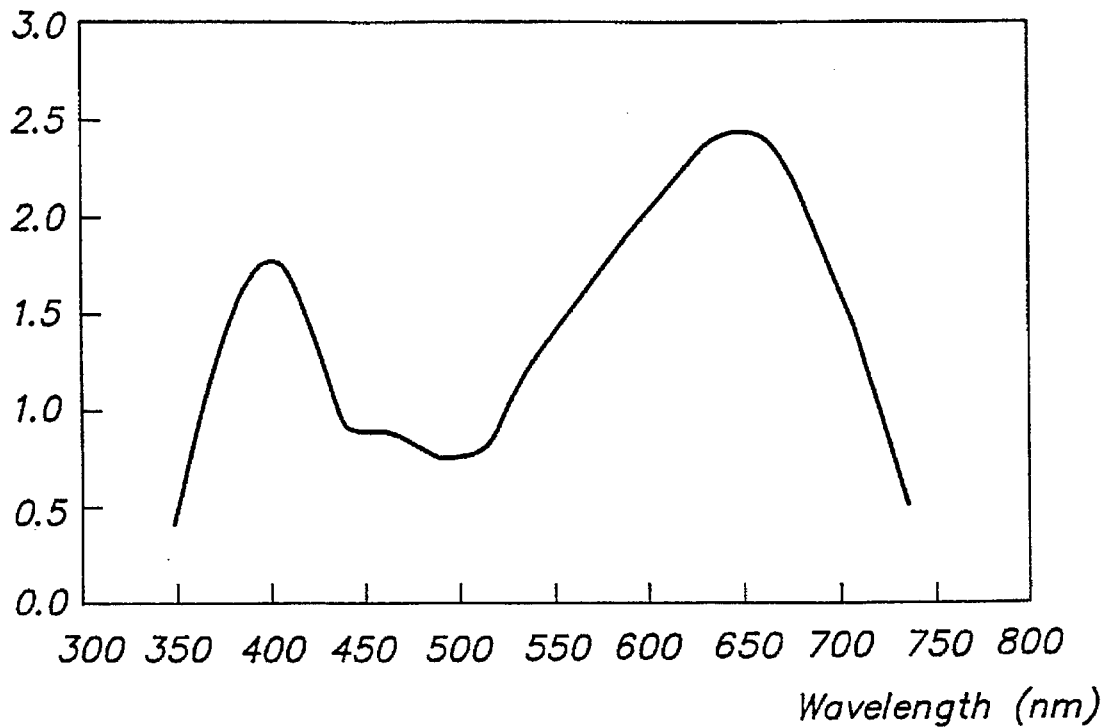
SETPRINT  FIG. 4
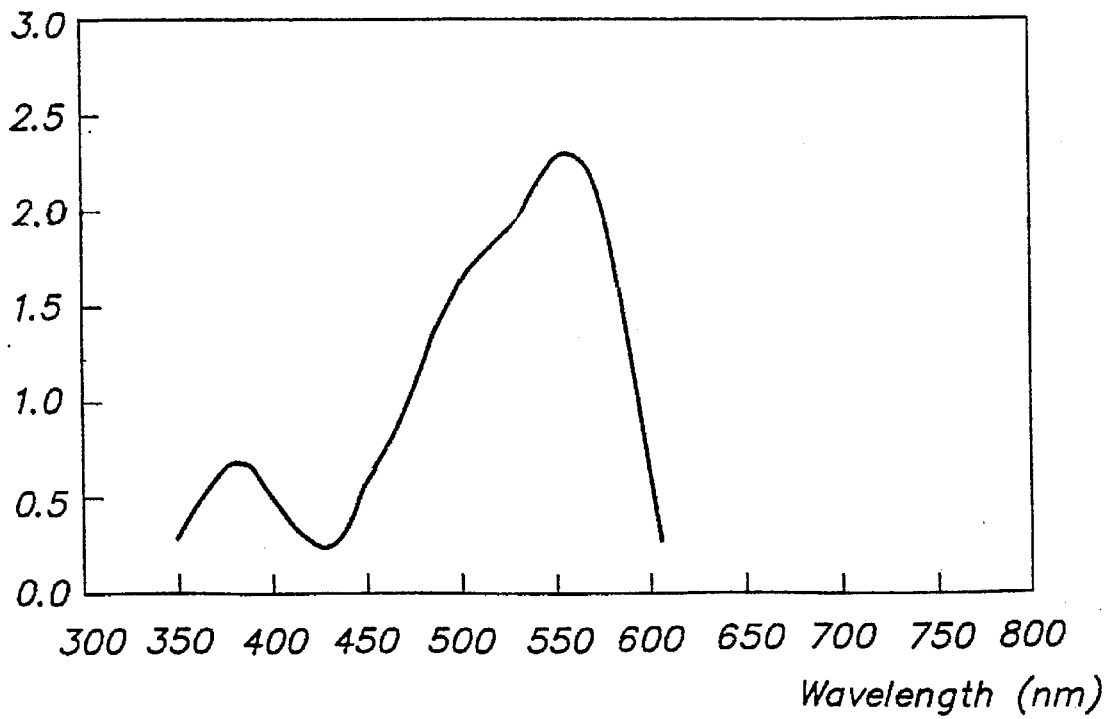
SUPERMASTER  FIG. 5

METHOD FOR PREPARING A LITHOGRAPHIC PRINTING PLATE

DESCRIPTION

1. Field of the Invention

The present invention relates to a method for preparing a lithographic printing plate, in particular to a method for preparing a lithographic printing plate comprising the steps of information-wise exposing an imaging element and thereafter processing the exposed imaging element by a diffusion transfer process.

2. Background of the Invention

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called "wet" printing plates, either water or an aqueous dampening liquid and ink are applied to the plate surface that includes hydrophilic and hydrophobic areas. The hydrophilic areas are soaked with water or the dampening liquid and are thereby rendered oleophobic while the hydrophobic areas will accept the ink. A second type of lithographic printing plate operate without the use of a dampening liquid and are called "driographic" printing plates. This type of printing plate comprises highly ink repellant areas and oleophilic areas. Generally the highly ink repellent areas are formed by a silicone layer.

Lithographic printing plates can be prepared using a photosensitive lithographic printing plate precursor, referred to herein as an "imaging element". Such an imaging element is exposed in accordance with the image data and is generally developed thereafter so that a differentiation results in ink accepting properties between the exposed and unexposed areas.

Examples of photosensitive lithographic imaging elements are, for example, the silver salt diffusion transfer (hereinafter referred to as DTR) materials disclosed in EP-A-410500, EPA-483415, EP-A-423399, imaging elements having a photosensitive layer containing diazonium salts or a diazo resin as described for example in EP-A-450199, and imaging elements having a photosensitive layer containing a photopolymerizable composition as described for example in EP-A-502562, EP-A-491457, EP-A-503602, EP-A-471483 and DE-A-4102173.

Silver salt diffusion transfer processes are known and have been described, for example, in U.S. Pat. No. 2,352,042 and in the book "Photographic Silver Halide Diffusion Processes" by Andre Rott and Edith Weyde—The Focal Press—London and New York (1972). In the DTR-process, non-developed silver halide of an information-wise exposed photographic silver halide emulsion layer material is transformed with a so-called "silver solvent" into soluble silver complex compounds which are allowed to diffuse into an information-receiving element and are reduced therein with a developing agent generally in the presence of physical development nuclei, to form a silver image having reversed image density values with respect to the silver image obtained in the exposed photographic material.

A process for obtaining a lithographic printing plate by means of a DTR process uses an imaging element comprising, in the order given, a support with a hydrophilic surface such as a grained and anodized aluminium foil, a layer of physical development nuclei and a silver halide emulsion layer. An example of such an imaging element is marketed by Agfa-Gevaert NV under the name LITHOSTAR. The imaging element of the present embodiment is imaged using a scanning exposure followed by a development step in the presence of development agent(s) and silver halide solvent(s) so that a silver image is formed in the physical development nuclei layer. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents.

Alternatively, a lithographic printing plate may be prepared from a "heat mode" recording material as a lithographic imaging element. Upon application of a heat pattern in accordance with image data and optional development the surface of such heat mode recording material may be differentiated in ink accepting and ink repellent areas. The heat pattern may be caused by a light source such as a laser. The heat mode recording material includes a substance capable of converting the light into heat. Heat mode recording materials that can be used for making a lithographic imaging elements are described for example in EP-A-92201633, DE-A-2512038, FR-A-1473751, Research Disclosure 19201 of April 1980 and Research Disclosure 33303 of January 1992.

From the above it will be clear that lithographic printing is only capable of reproducing two tone values because the areas will accept ink or not. Thus lithographic printing is a so called "binary" process. In order to reproduce originals having continuously changing tone values by such processes, halftone screening techniques are applied.

In a commonly used halftone screening technique, the continuously changing tone values of the original are modulated with periodically changing tone values of a superimposed two-dimensional screen. The modulated tone values are then subject to a thresholding process wherein tone values above a threshold value will be reproduced and those below will not. The process of tone-value modulation and thresholding results in a two-dimensional arrangement of equally spaced "screen dots" whose dimensions are proportional to the tone value of the original at that particularly location. The number of screen dots per unit distance determines the screen frequency or screen ruling. This screening technique, wherein the screen frequency is constant and inversely proportional to the halftone cell size and, hence, to the maximum density of the screen dot, is referred to as "amplitude-modulation screening" or "autotypical screening". This technique can be implemented photo-mechanically or electronically.

The electronic implementation of autotypical screening is a digital process whereby the continuous tone values of the original are broken up into discrete tone-value levels, specified at discrete areal co-ordinates within the original image. Each tone value is compared with an electronic threshold level, and values above the threshold are reproduced while those below the threshold are not. Screen dots are formed when a specific pattern of threshold values is defined in a two-dimensional array corresponding to the size of a halftone cell, and this threshold pattern is periodically applied across the image.

Frequency modulation screening is a technique in which the continuously changing tone values of an original are reproduced by means of equally sized micro-dots, the number of which is proportional to the tone value of the original image. The term "frequency modulation" refers to the fact that the number of micro-dots per unit surface (the frequency) fluctuates in proportion to the tone value in that same area.

A method for preparing a printing plate is known in which the method comprises the steps of information-wise exposing an imaging element and thereafter processing the exposed imaging element. Such a method is also known as a "computer to plate" method. The exposing step comprises generating a modulated writing light beam having a wavelength to which the imaging element is sensitive and directing the writing light beam to a moving mirror to cause the writing light beam to scan across the surface of the imaging element in a first scanning direction. A reference light beam is generated and directed to the moving mirror simultaneously with the writing light beam to cause-the reference light beam to scan across the surface of a light detecting element in the first scanning direction. Since the writing light beam and the reference beam are both deflected by the same moving mirror, the reference beam falling on the light detecting element causes the generation of synchronising signals indicative of the position of the writing light beam on the surface of the imaging element. The writing light beam is modulated and the imaging element is moved in a second scanning direction in response to the synchronising signals generated by the light detecting element. In this manner any imperfections in the surface of the moving mirror, or in its movement, are accounted for.

The writing light beam is modulated as the scanning process proceeds, in order to information-wise expose the imaging element. The reference light beam is not modulated, but is of constant intensity. If the light from the reference beam were to fall on the imaging element, the quality of the printed image would be reduced. One approach to this problem comprises the careful mechanical screening of the imaging element from the reference beam. The provision of such screening is inconvenient and costly and does not completely shield the imaging element from light incident from the reference beam.

The problem of loss of quality, especially of tone range in the final print, arises particularly if a frequency modulation screening method is employed, depending on the micro-dot size, and/or if an autotypical screening method at line frequencies above 150 lines per inch is employed. This problem of loss of quality also arises especially with imaging elements which are sensitive to edge-sharpness defects.

SUMMARY OF THE INVENTION

It is an object of the present invention to provide a method for preparing a lithographic printing plate in which inadvertent exposure of the imaging element by the reference beam does not degrade the quality of the printed end product.

According to the invention there is provided a method for preparing a lithographic printing plate comprising the steps of information-wise exposing an imaging element and thereafter processing the exposed imaging element by a diffusion transfer reversal process, wherein the exposing step comprises:

(i) generating a writing light beam having a wavelength to which the imaging element is sensitive;

(ii) directing the writing light beam to a moving optical device to cause the writing light beam to scan across the surface of the imaging element in a first scanning direction;

(iii) generating a reference light beam;

(iv) directing the reference light beam to the moving optical device simultaneously with the writing light beam to cause the reference light beam to scan across the surface of a light detecting element in the first scanning direction to generate signals indicative of the position of the writing light beam on the surface of the imaging element; and (v) modulating the writing light beam and moving the imaging element in a second scanning direction in response to the signals generated by the light detecting element, characterised in that the reference light beam has a wavelength to which the imaging element is insensitive.

By providing the reference beam with a wavelength to which the imaging element is insensitive, no inadvertent exposure of the imaging element occurs. The present invention provides a method for preparing a lithographic printing plate in which an enlarged tonal range can be achieved together with a greater latitude of correct exposure.

The method of the present invention can be used with lithographic printing plate precursors having a surface that can be differentiated upon image-wise exposure and an optional development step.

Examples of printing plate precursors that can be used in connection with the present invention are printing plate precursors having a photosensitive layer or a heat mode recording layer.

A particularly suitable printing plate precursor or imaging element is a so-called mono-sheet DTR material. Two variants of such DTR materials for making a lithographic printing plates are known and can be used.

A first type of mono-sheet DTR material comprises on a support in the order given a silver halide emulsion layer and an image receiving layer containing physical development nuclei e.g. a heavy metal sulphide such as PdS. The image receiving layer is preferably free of binder or contains a hydrophilic binder in an amount of not more than 30% by weight. Subsequent to image-wise exposure, the mono-sheet DTR material is developed using an alkaline processing liquid in the presence of developing agents e.g. of the hydroquinone type and/or pyrazolidone type and a silver halide solvent such as e.g. a thiocyanate. Subsequently, the plate surface is neutralised with a neutralising liquid. Details about the constitution of this type of mono-sheet DTR material and suitable processing liquids can be found in e.g. EP-A-423399, U.S. Pat. No. 4,501,811, and U.S. Pat. No. 4,784,933. Lithographic printing plate precursors of this type are marketed by Agfa-Gevaert NV under the names SETPRINT and SUPERMASTER.

The second type of mono-sheet DTR material also suitable for use in connection with the present invention comprises on a toughened and anodized support in the order given an image receiving layer as described above, a hydrophilic layer and a silver halide emulsion layer. Subsequent to image-wise exposure, the mono-sheet DTR material is developed using an alkaline processing liquid in the presence of developing agents e.g. of the hydroquinone type and/or pyrazolidone type and a silver halide solvent such as e.g. a thiocyanate. Thereafter, the plate is rinsed with water, preferably warm water, to remove the silver halide emulsion layer and the hydrophilic layer. The obtained silver image in the image receiving layer may further be treated with a hydrophobizing liquid containing hydrophobizing agents to improve the ink accepting properties of the silver image. Details about the constitution, processing liquid and method for developing the mono-sheet DTR material may be found in EP-A-410500 and EP-A-483415. Because of the stiffness of the aluminium support, this type of imaging element is preferably exposed using a flat-bed scanner.

Another type of imaging element suitable for use is one comprising a support having a hydrophilic surface or being coated with a hydrophilic layer, and a photosensitive layer containing a diazo resin, diazonium salt, a photopolymerizable composition or a chinone diazide. Imaging elements having such a photosensitive layer are disclosed in EP-A-450199, EP-A-502562, EP-A-487343, EP-A-491457, EP-A-503602, EP-A-471483, DE-A-4102173, and Japanese laid-open patent application number 244050/90. Subsequent to exposure, these imaging elements are developed using plain water, a developing liquid which generally is a mixture of water and one or more organic solvents or some of them may be developed using a delamination foil.

An imaging element that can be used to yield driographic printing plates is disclosed for example in EP-A-475384, EP-A-482653, and EP-A-484917.

It is also possible to use imaging elements having a heat mode recording layer. Such heat mode recording layer is a layer containing a substance that is capable of converting light into heat. Examples of heat mode recording layers include vacuum or vapour deposited bismuth or aluminium layers, layers containing infra-red dyes or pigments, and layers containing carbon black. Suitable heat mode recording materials for use in connection with the present invention are described for example in DE-A-2512038, Research Disclosure 19201 of April 1980, Research Disclosure 33303 of January 1992, EP-A-92201633 and FR-A-1473751. The latter two heat mode recording materials do not require a developing step or can be developed by simply wiping the heat mode recording material with, for example, a dry cotton pad.

A particularly interesting heat mode recording material that can be used in connection with the present invention comprises a support carrying a heat mode recording layer and a hardened hydrophilic surface layer having a thickness of not more than 3 µm. After information-wise exposure in accordance with the present invention, preferably through said hardened hydrophilic surface layer, the plate may be used directly on a printing press using a dampening liquid or the plate surface may first be wiped with a dry cotton pad. Printing plates of high quality are obtained.

A further alternative heat mode recording material that can be used in connection with the present invention comprises a support, preferably polyester, which carries a heat mode recording layer and a highly ink repellant layer such as a silicone layer. Such a heat mode recording layer is preferably exposed through the support and afterwards it may be developed by rubbing the print surface.

Imaging elements suitable for DTR processing typically have a maximum sensitivity within the range of 400 to 800 nm, depending upon the nature of the imaging element. Thus, LITHOSTAR LAP-B has a maximum sensitivity at about 490 nm, LITHOSTAR LAP-0 has a maximum sensitivity at about 550 nm, and the SUPERMASTER range of imaging elements also have a maximum sensitivity at about 550 nm. Thus, in accordance with preferred embodiments of the present invention, the writing light beam has a wavelength within the range of 400 to 800 nm, such as from 450 to 600 nm.

The reference light beam preferably has a wavelength at least 50 nm outside the sensitivity range of the imaging element and/or at least 100 nm from the maximum sensitivity of the imaging element. Thus, we prefer that the reference light beam has a wavelength of less than 450 nm, such as within the range of 350 to 400 nm.

Suitable devices for scan-wise exposure of a lithographic imaging element are for example cathode ray tubes, LEDs and lasers. It is preferred that both the writing light beam and the reference light beam are generated by lasers and/or LEDs, since these types of light sources provide a narrow wavelength band, the particular type of laser and power being dependent upon the type of imaging element. Diode lasers, which are commercially available at an economic price and which are very compact, are particularly useful. Generally a lithographic imaging element based on a silver halide photosensitive layer will require less powerful lasers while heat mode recording materials will generally require more powerful lasers.

Examples of lasers that can be used include He/Ne lasers, Argon ion lasers, semiconductor lasers, and YAG lasers such as Nd-YAG lasers. Most suitable laser sources include blue Ar-ion lasers (488 nm), green HeNe lasers (543 nm), red HeNe lasers (630 nm), frequency doubled Nd-YAG lasers (532 nm), and extended red LEDs (670 nm), the choice of lasers being made according to the nature of the imaging element.

The imaging element may be supported on a surface of a movable platen.

The moving optical device may be constituted by a rotating single-or multi-faceted mirror having, for example, from 4 to 32 facets (mirrors having 6, 8, 16 and 32 facets are commercially available) or alternatively by an oscillating (galvanometric) mirror.

After the imaging element has been information-wise exposed, it is processed according to a diffusion transfer technique.

The present invention is particularly beneficial where the writing beam is modulated in accordance with frequency modulation screening of the continuously changing tone values of an original image. A suitable frequency modulation screening technique for use in connection with the present invention is the well-known "error diffusion" technique first described by Floyd and Steinberg in "An adaptive algorithm for spatial grey scale" SID/75 Digest, Society for Information Display 1975, pp. 36-37.

A more preferred variant of frequency modulation screening is described in EP-A 93201114.1 (Agfa-Gevaert).

The invention will now be further described, purely by way of example, by reference to the accompanying Figures in which:

BRIEF DESCRIPTION OF THE DRAWINGS

FIGS. 2, 3, 4 and 5 show sensitivity spectra for various imaging elements which can be used in the method according to the present invention.

PREFERRED EMBODIMENTS OF THE INVENTION

Figure 1:
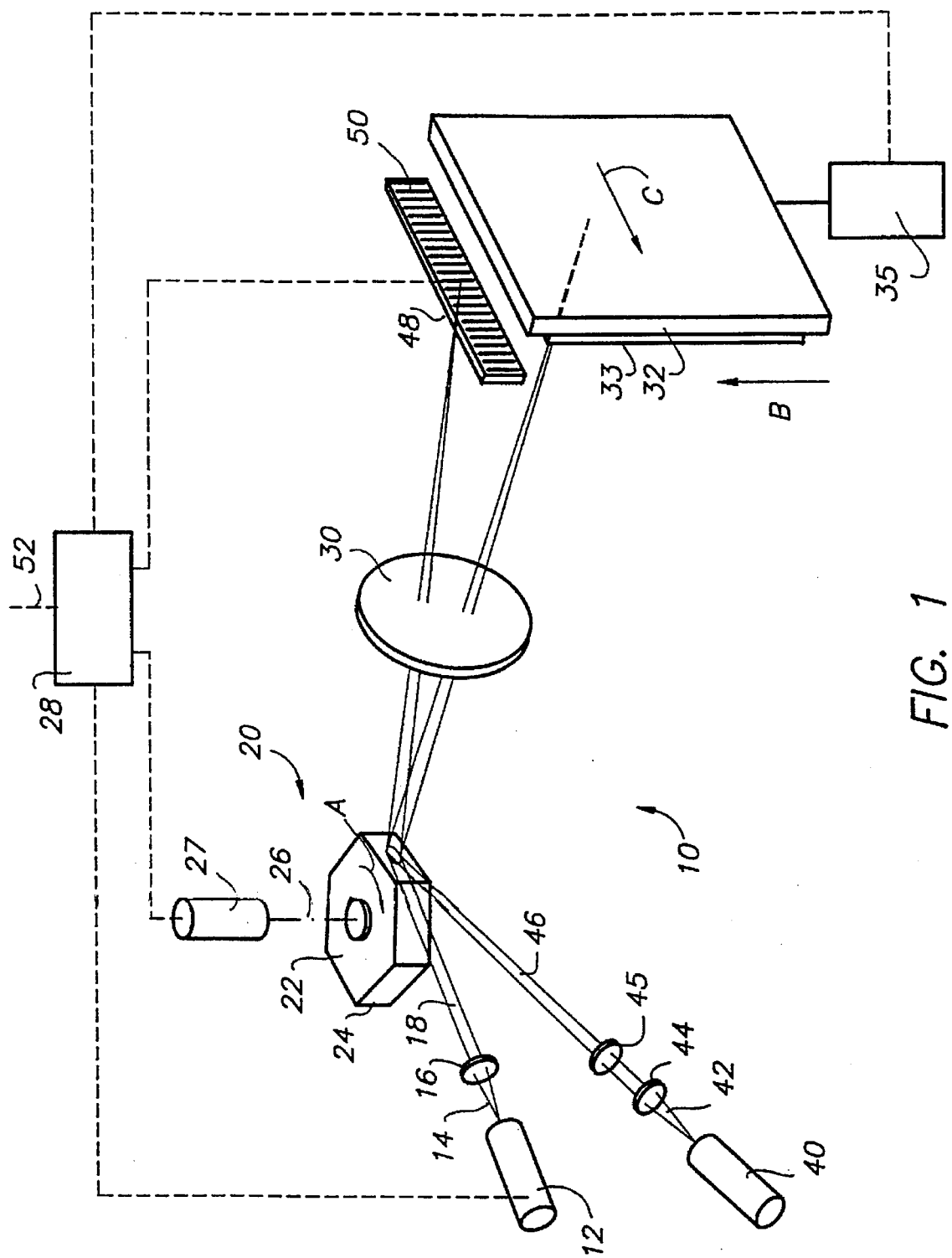
FIG. 1 schematically shows a light scanning device for use in a method according to the invention.

Referring to the Figure, there is shown a light scanning device 10 including a first laser 12 which emits a modulated writing light beam 14. The emitted writing light beam 14 is applied to a collimator lens 16 and converted thereby to a parallel-ray light beam 18. The light beam 18 is received by an optical assembly 20 that comprises a polygonal mirror 22 having a plurality of mirror facets 24, in this case six such facets, which is rotated about an axis 26 by means of motor 27 in the direction of the arrow A in response to signals received from a controller 28. The deflected light beam 18 is applied to an f(Θ) lens 30 positioned in the optical path, and is converged by the f(Θ) lens 30 on to a flat movable platen 32 which carries a DTR imaging element 33. The writing light beam 18, as it is deflected by the rotating polygonal mirror 22, scans the image element 33 in a main scanning direction indicated by the arrow C while the movable platen 32 is moved, together with the imaging element 33 in the direction of the arrow B (the sub-scanning direction) with the result that the whole of the imaging element 33 is two-dimensionally scanned. The movable platen 32 is moved by a controllable drive means generally indicated by reference 35. The f(Θ) lens 30 serves as a scanning lens for scanning the imaging element 33 at a constant speed with the writing light beam 18 which is deflected by the rotating polygonal mirror 22 at a constant angular speed.

The light scanning device 10 also includes a second laser 40 which is positioned below the level of the polygonal mirror 22 and which emits an unmodulated reference light beam 42. The emitted reference light beam 42 is applied to a collimator lens 44 and a converging lens 45 and converted thereby to a converging reference light beam 46. The reference light beam 46 is also directed to the polygonal mirror 22, striking the latter on the same facet as the writing light beam 18, but at an oblique angle thereto. Ideally, the reference light beam 46 strikes the mirror facet at substantially the same position as the writing light beam 18. The deflected reference light beam 46 is applied to the f(Θ) lens 30, and is converged by the f(Θ) lens 30 on to stationary reference mask 48 out of the plane of the scanning writing light beam 18. The reference mask carries a light detecting element in the form of a photodetector array 50. The reference light beam 46, as it is deflected by the rotating polygonal mirror 22, scans the reference mask 48 in the same direction as the main scanning direction C. This causes the generation of synchronising signals by the photodetector array 50 indicative of the position of the writing light beam on the imaging element 33. These signals either indicate the position of the writing beam directly, or do so indirectly by indicating the speed of movement and/or acceleration of the writing beam on the imaging element 33 at any point in time. These signals may additionally the indicate the power of the writing beam falling on the imaging element 33. The synchronising signals are fed to the controller 28. In response to the synchronising signals generated by the photodetector array 50, and in accordance with information instruction signals received along line 52, the controller 28 controls the first laser 12 to cause the writing light beam 18 to be modulated and also controls the platen drive means 35 to cause the movable platen 32 to be moved in the sub-scanning direction B. In this manner any imperfections in the surface of the moving mirror, or in its movement, are detected, and appropriate compensations in the exposure process are made.

After exposure, the imaging element is removed from the platen 32 and processed according to a diffusion transfer technique.

FIGS. 2 to 5 illustrate, for different types of an imaging element, the relative spectral sensitivity S on a logarithmic scale (log S), and is experimentally evaluated by monochromator sensitometric exposures with a wavelength as indicated on the horizontal axis.

For a good understanding, it may be stated that said sensitivity S is the reciproke of the exposure H thus S=1/H), wherein H preferably is expressed in e.g. mJ/m$^2$.

By the expression "the reference light beam has a wavelength to which the imaging element is insensitive", in the present application, is ment that the relative sensitivity of the imaging element at the wavelength of the reference beam is at least 2.5 units of Log S, which difference is equivalent to a ratio of about 300 units of S, below the maximum sensitivity of the imaging element.

Thereabove, it may be clear that the energy of the reference beam principally is lower than or equal to the energy of the writing beam. The energy of the writing beam is mainly defined by the sensitivity of the imaging element and illuminates the imaging element with e.g. 1 to 6 mJ/m$^2$, depending from the specific type of the imaging element, whereas the energy of the reference beam is mainly defined by the sensitivity of a photodetector area 50 (cfr. FIG. 1) The present invention will now be further illustrated by the following non-limiting example.

EXAMPLES 1 & 2

Using the apparatus as shown in the Figure, the writing laser 12 being a blue argon ion laser (wavelength 488 nm) and the reference laser 40 being a HeNe laser (wavelength 630 nm), optimised in terms of exposure power, a commercially available silver salt diffusion transfer lithographic printing plate (LITHOSTAR LAP-B, available from Agfa-Gevaert NV) was information-wise exposed with screened cyan, magenta, yellow and black separations of a colour image. In Example 1 the image was screened autotypically at 200 lines/inch. In Example 2 the image was screened by frequency modulation using CRYSTAL RASTER (Trade Mark—available from Agfa-Gevaert NV). In both examples the imaging element was subsequently developed using the processing liquid G5000B and the finishing liquid G5300B each available from Agfa-Gevaert NV. For the purposes of comparison, the examples were repeated, but with the reference laser 40 removed.

The so-formed printing plates were used on a conventional printing machine Heidelberg GT052 using Hartmann Irocart inks to print 50 copies on paper sheet. The dampening liquid used was an aqueous solution containing 100% Rotamatic (commercially available from Rotaprint). The printing paper used was Zanders Ikonorex. The printed copies were examined and assessed for quality, specifically for contrast, tone range and finest rendered microdot size.

We claim:

1. A method for preparing a lithographic printing plate, comprising the steps of:
   (a) exposing information-wise an imaging element, the exposing step comprising:
      (i) generating a modulated writing light beam having a wavelength to which the imaging element is sensitive;
      (ii) directing the writing light beam to a moving optical device to cause the writing light beam to scan across the surface of the imaging element in a first scanning direction;
      (iii) generating a reference light beam having a wavelength to which the imaging element is insensitive;
      (iv) directing the reference light beam to the moving optical device simultaneously with the writing light beam to cause the reference light beam to scan across the surface of a light detector element in the first scanning direction to generate signals indicative of the position of the writing light beam on the surface of the imaging element; and
      (v) moving the imaging element in a second scanning direction in response to the signals generated by the light detector element; and (b) processing the exposed imaging element by a diffusion transfer process which comprises developing an exposed silver halide layer in the presence of a silver halide solvent, to transfer a silver halide complex to an image receiving layer to form an image in the image receiving layer.

2. The method according to claim 1, wherein the step of generating a modulated writing light beam comprises generating a light beam having a wavelength within the range of 400 nm to 800 nm.

3. The method according to claim 1, wherein the step of generating a reference light beam comprises generating a light beam having a wavelength of at least 50 nm outside the sensitivity range of the imaging element.

4. The method according to claim 1, wherein the step of generating a reference light beam comprises generating a light beam having a wavelength at least 100 nm from the maximum sensitivity of the imaging element.

5. The method according to claim 1, further comprising a step of supporting the imaging element on a surface of a movable platen.

6. The method according to claim 1, wherein the steps of directing the writing and reference light beams comprise reflecting the light beams off a rotating multi-faceted mirror.

7. The method according to claim 1, wherein the steps of directing the writing and reference beams comprise reflecting the beams off an oscillating mirror.

8. The method according to claim 1, further comprising a step of sending an information-wise exposure from a computer for generating the modulated writing light beam.

9. The method according to claim 1, wherein generating the modulated writing light beam comprises modulation screening of continuously changing tone values of an original image.

* * * * *

UNITED STATES PATENT AND TRADEMARK OFFICE
CERTIFICATE OF CORRECTION

PATENT NO. : 5,635,321

DATED : June 3, 1997

INVENTOR(S) : Van Hunsel et al.

It is certified that error appears in the above-identified patent and that said Letters Patent is hereby corrected as shown below:

On title page,
3rd line of Item 56, "3,950,888    4/1976" should read --4,950,888    8/1990--.

Signed and Sealed this

Twenty-fourth Day of March, 1998

Attest:

BRUCE LEHMAN

*Attesting Officer*     Commissioner of Patents and Trademarks